United States Patent
Henry

(10) Patent No.: US 11,159,119 B2
(45) Date of Patent: Oct. 26, 2021

(54) ENERGY STORAGE SYSTEM

(71) Applicants: Massachusetts Institute of Technology, Cambridge, MA (US); Georgia Tech Research Corporation, Atlanta, GA (US)

(72) Inventor: Asegun Henry, Boston, MA (US)

(73) Assignees: Massachusetts Institute of Technology, Cambridge, MA (US); Georgia Tech Research Corporation, Atlanta, GA (US)

( * ) Notice: Subject to any disclaimer, the term of this patent is extended or adjusted under 35 U.S.C. 154(b) by 50 days.

(21) Appl. No.: 16/808,755

(22) Filed: Mar. 4, 2020

(65) Prior Publication Data

US 2020/0358390 A1 Nov. 12, 2020

Related U.S. Application Data

(60) Provisional application No. 62/832,659, filed on Apr. 11, 2019.

(51) Int. Cl.
| | |
|---|---|
| *H02S 10/30* | (2014.01) |
| *F24S 60/30* | (2018.01) |
| *F28D 20/00* | (2006.01) |
| *H02S 40/22* | (2014.01) |
| *H01L 31/042* | (2014.01) |
| *H01L 31/0352* | (2006.01) |

(52) U.S. Cl.
CPC ............. *H02S 10/30* (2014.12); *F24S 60/30* (2018.05); *F28D 20/0034* (2013.01); *H02S 40/22* (2014.12); *H01L 31/0352* (2013.01); *H01L 31/042* (2013.01); *Y02E 10/40* (2013.01); *Y02E 10/52* (2013.01); *Y02E 60/14* (2013.01); *Y02E 70/30* (2013.01)

(58) Field of Classification Search
CPC .......... H02S 10/30; H02S 40/22; F24S 60/30; F24D 20/0034; H01L 31/042; H01L 31/0352; Y02E 70/30; Y02E 60/14; Y02E 10/52; Y02E 10/40
See application file for complete search history.

(56) References Cited

U.S. PATENT DOCUMENTS

| | | | |
|---|---|---|---|
| 4,074,705 A * | 2/1978 | Robinson, Jr. .......... | F24S 20/67 126/584 |
| 2006/0048808 A1 | 3/2006 | Ruckman et al. | |
| 2012/0097216 A1 * | 4/2012 | Lin ........................ | F24S 23/00 136/248 |
| 2013/0004801 A1 | 1/2013 | Henry | |
| 2014/0272639 A1 | 9/2014 | Zietlow | |
| 2018/0097259 A1 | 4/2018 | Bradwell et al. | |

FOREIGN PATENT DOCUMENTS

CN 205790027 12/2016

* cited by examiner

*Primary Examiner* — Matthew T Martin
(74) *Attorney, Agent, or Firm* — Wolf, Greenfield & Sacks, P.C.

(57) ABSTRACT

Energy storage systems are disclosed. The systems may store energy as heat in a high temperature liquid, and the heat may be converted to electricity by absorbing radiation emitted from the high temperature liquid via one or more photovoltaic devices when the high temperature liquid is transported through an array of conduits. Some aspects described herein relate to reducing deposition of sublimated material from the conduits onto the photovoltaic devices.

20 Claims, 6 Drawing Sheets

12
ENERGY STORAGE SYSTEM

CROSS-REFERENCE TO RELATED APPLICATIONS

This application claims the benefit under 35 U.S.C. § 119(e) of U.S. Provisional Application Ser. No. 62/832,659, filed Apr. 11, 2019, the disclosure of which is incorporated by reference in its entirety.

GOVERNMENT LICENSE RIGHTS

This invention was made with Government support under Grant No. DE-AR0001005 awarded by the Department of Energy (DOE ARPA-E). The Government has certain rights in the invention.

FIELD

Disclosed embodiments are related to energy storage systems, and more specifically, to energy storage systems configured to store heat in a high temperature liquid.

BACKGROUND

Energy storage systems are used to store energy generated by various energy sources, such as renewable energy sources (e.g., solar, hydroelectric, wind, and/or geothermal sources) and/or other energy sources (e.g., fossil fuels, natural gas, nuclear, coal, etc.). In some applications, energy storage systems are used for grid-scale storage to help balance differences between energy supply and demand. For example, some renewable energy sources may generate energy during periods of low energy demand, and the excess energy may be stored until demand increases, at which time the stored energy may be supplied to meet the increased demand. Various approaches for energy storage include pumped hydroelectric energy storage, compressed air energy storage, and electrochemical energy storage in one or more batteries.

SUMMARY

In one embodiment, an energy storage system comprises a conduit constructed and arranged to transport liquid, a photovoltaic device, a gap positioned between the conduit and the photovoltaic device, and an intermediate layer positioned between the conduit and the gap. A vapor pressure of a material of the intermediate layer is less than a vapor pressure of a material of the conduit.

In another embodiment, an energy storage system comprises an array of conduits constructed and arranged to transport a liquid from a first end of the array to a second end of the array, a plurality of photovoltaic devices, and a plurality of gaps formed in the array of conduits. Each gap comprises an opening at at least one end of the array of conduits, and each gap is constructed and arranged to receive at least one of the plurality of photovoltaic devices. The system further comprises a plurality of intermediate layers, and each intermediate layer is positioned between the conduits of the array of conduits and each gap of the plurality of gaps. A vapor pressure of a material of the intermediate layer is less than a vapor pressure of a material of the conduit.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
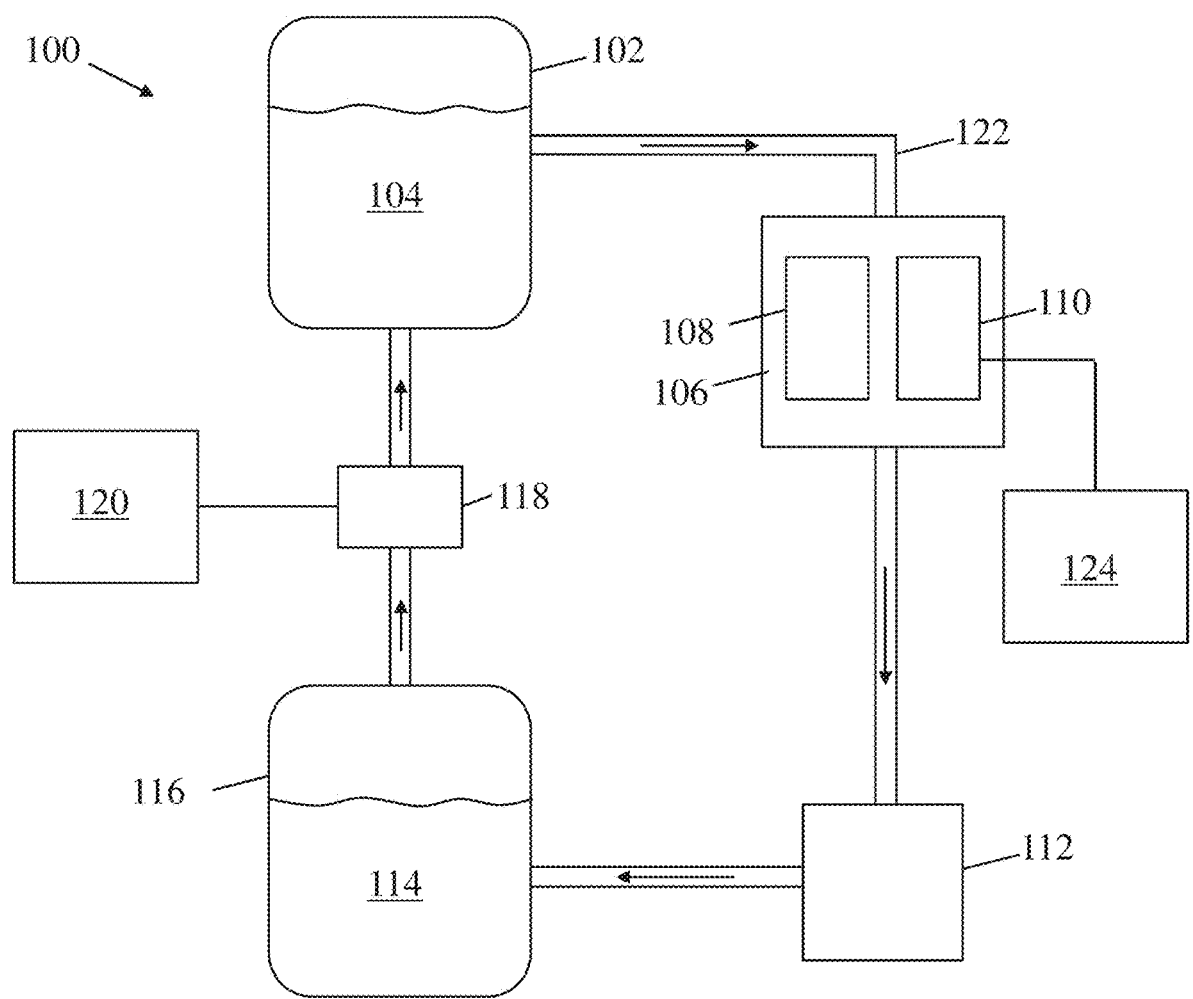
FIG. 1 is a schematic representation of an energy storage and conversion system, according to some embodiments.

Aspects described herein relate to energy storage systems such as, for example, grid-scale energy storage. The inventors have appreciated that while the costs associated with generating energy from many renewable energy sources (e.g., solar and wind) are approaching those associated with conventional energy sources (e.g., fossil fuels), in many cases, renewable energy is not available when it is needed. For instance, generation of solar and wind energy depend on weather conditions. In other cases, the cost of generating energy (including from non-renewable sources) may be lower at times of low energy demand. Accordingly, the inventors have appreciated numerous benefits associated with energy storage systems that can store energy (such as energy created by one or more renewable energy sources and/or energy generated during low cost periods) and release the energy at a later desired time, such as upon an increase in energy demand. In this manner, the energy storage systems described herein may provide for dispatchability of energy generated by various energy sources. While some systems have been developed to provide such grid-scale energy storage, such as pumped hydroelectric systems, and electrochemical systems, the inventors have recognized and appreciated numerous drawbacks associated with these approaches. For example, pumped hydroelectric energy storage systems are limited by geography, and electrochemical systems are often expensive and inefficient.

In view of the above, the inventors have recognized and appreciated numerous benefits associated with energy storage systems that are configured to store energy as heat. In particular, heat storage may be substantially cheaper than electricity storage in electrochemical systems, and is not limited geographically like pumped hydroelectric systems. Moreover, in some instances, the systems described herein may allow for cheaper storage of electricity compared to existing systems, for example, based on the cost per unit energy stored and/or the cost per unit power stored.

In some embodiments, the energy storage systems described herein may store heat in a high temperature liquid, such as liquid silicon, liquid iron, liquid alumina, liquid silica, liquid ferrosilicon, liquid, boron, liquid metal oxides such as iron oxide, liquid salts, oils, or other suitable liquid materials. Energy from one or more energy sources, including renewable and/or non-renewable energy sources may be used to heat the liquid to a first, high temperature, and the liquid may be stored in a first liquid storage tank configured to maintain the liquid at the first temperature. In some applications, the first liquid storage tank may be constructed and arranged to provide a low surface area to volume ratio for the liquid contained therein, which may aid in reducing heat loss from the liquid while the liquid is stored in the first liquid storage tank.

Energy may be recovered from the high temperature liquid via one or more photovoltaic devices. In particular, the high temperature liquid may be transported through a series of conduits, such as pipes, tubes, channels or other constructions. Heat transfer from the liquid to the conduits may heat the conduits to an appropriate temperature to cause the conduits to emit electromagnetic radiation with any appropriate range of wavelengths including, but not limited to visible light (400 nm to 700 nm), infrared radiation (700 nm to 1 mm), and/or any other appropriate range of wavelengths as the disclosure is not so limited. In particular, the conduits may be heated to a temperature sufficient to create a substantial flux of energy radiating from the conduits. For example, in some embodiments, the energy flux radiated from the conduits may be between about 5 10 kW/m$^2$ and about 10 kW/m$^2$, which may correspond to kilowatts or megawatts of power recovered from the systems depending on the particular system sizing. In some instances, these energy fluxes may correspond to the conduits being heated to temperatures between about 1400° C. and about 2600° C., 2000° C. to about 2600° C., or another appropriate range of temperatures.

The radiation emitted from the conduits may be absorbed by one or more photovoltaic devices to convert the radiation into electricity. In this manner, the system may convert energy in the form of heat stored in the liquid into electricity. In some embodiments, the one or more photovoltaic devices may comprise multi-junction photovoltaics, which may provide for absorption of a broader range of wavelengths of radiation, thereby improving the efficiency of the conversion from heat in the liquid to electricity. For example, a multi-junction photovoltaic device may be included in some embodiments of an energy storage system.

In some embodiments, a high temperature liquid transported through the conduits may be at a temperature of between about 1400° C. and about 2600° C. (e.g., about 2400° C. for systems utilizing liquid silicon). To accommodate these high temperatures, the conduits may be formed from a suitable high melting point material with a melting temperature that is greater than a temperature of the high temperature liquid contained therein. Appropriate types of materials may include, but are not limited to, graphite, tungsten, silicon carbide, silicon nitride, aluminum nitride, zirconium carbide, other refractory carbides, nitrides, borides, and/or oxides. However, the inventors have recognized and appreciated that at these high temperatures, the vapor pressure of many materials, including carbon, may be relatively high in comparison to the vapor pressure of the material at room temperature. These elevated vapor pressures may lead to undesirable sublimation or evaporation of the material of the conduits during high temperature operation and recapture of previously stored energy. The sublimated material may subsequently deposit onto any exposed surface at a lower temperature. This may include sublimation of the material and deposition onto the photovoltaic devices of the system, which may block subsequent absorption of radiation by the photovoltaic devices and degrade performance of the photovoltaic device. Indeed, the inventors have appreciated that even very thin layers of material (e.g., as thin as a few atomic layers) deposited onto the photovoltaic devices may drastically degrade the performance of the photovoltaic device. Accordingly, some aspects described herein relate to reducing deposition of sublimated material sublimated onto the photovoltaic devices, which may provide for improved efficiency of the systems, reduced maintenance requirements for the systems (e.g., for cleaning or replacement of the photovoltaic devices), and/or longer system lifetimes. For example, in some instances, the embodiments described herein may provide for systems having an expected lifetime of 30 years or more.

In some embodiments, one or more conduits may be separated from corresponding photovoltaic devices by an intermediate layer, and the intermediate layer may be formed of a material having a lower vapor pressure than a material of the conduits when both are at their elevated operating temperatures (e.g. about a temperature of the high temperature liquid contained in the conduits). In this manner, the intermediate layer may reduce the vapor pressure of material within the systems that may interact with the photovoltaic devices, which may lead to substantially reduced sublimation. The intermediate layer may be formed as a film, one or more tubes, one or more chambers, a wall, foil structures, a coating disposed on one or more conduits, combinations of one or more of the forgoing structures, and/or any other structure that provides a barrier between the conduits and the photovoltaic devices to reduce the vapor pressure adjacent the photovoltaic device and correspondingly reduce deposition of sublimated material onto the photovoltaic devices.

According to some aspects, an intermediate layer between one or more conduits transporting a high temperature liquid and one or more photovoltaic devices may act as a diffusion barrier that physically blocks sublimated atoms from the conduits from diffusing towards and depositing onto the photovoltaic devices. For example, in one embodiment, the one or more conduits may be formed from graphite, and the intermediate layer may be formed from tungsten, and the tungsten intermediate layer may block diffusion of sublimated carbon atoms towards the photovoltaic devices, thereby reducing or substantially preventing undesirable deposition of material onto the photovoltaic devices. Additionally, due to the tungsten, or other intermediate layer, having a reduced vapor pressure as compared to the material of the conduits at these temperatures, the gas space between the barrier and the photovoltaic device will exhibit a reduced partial pressure of sublimated materials as compared to the gas space between the barrier and conduits. Of course, while particular materials are noted above, other materials that may be suitable for the intermediate layer may include, but are not limited to, rhenium, tantalum, and/or alloys of tungsten, rhenium, and/or tantalum, as well as any other appropriate material (e.g., carbides, nitrides, borides, and/or oxides) with a vapor pressure less than a corresponding vapor pressure of a material of the corresponding conduits through which a high temperature liquid is contained.

In addition to providing a lower vapor pressure of sublimated materials adjacent a photovoltaic device, an intermediate layer may also form an emission surface configured to radiate energy (e.g., visible light and/or infrared radiation) towards the photovoltaic devices. For example, the intermediate layer may be positioned adjacent one or more conduits carrying a high temperature liquid, and heat from the conduits may be transferred to the intermediate layer (e.g., via conductive, convective, and/or radiative heating). Upon heating, the intermediate layer may radiate the absorbed energy towards the photovoltaic devices, which may subsequently absorb the radiation and convert it to electricity, as discussed above.

In some embodiments, one or more emitters may be provided on the intermediate layer, and the emitters may be configured to improve emission of radiation from the intermediate layer towards the photovoltaic devices. For example, the emitters may be formed as fins extending from the intermediate layer and towards the photovoltaic devices. The fins may provide an increased surface area from which radiation can be emitted which may allow for an increased flux of radiation emitted from the intermediate layer. Depending on the particular embodiment, one or more dimensions of the fins, such as a width of each fin, a spacing between tins, and/or a length that the fins extend from the intermediate layer may be selected to provide a desired radiation emitting geometry. For example, the dimensions of the fins may be optimized based on the dimensions and/or configuration of the photovoltaic devices used in a particular system. Moreover, it should be understood that the fins (or other emitters) may have any suitable shape and configuration. For example, in some applications, straight fins may beneficially provide for easier manufacturing, while in other applications, other fin geometries may be selected to provide a desired radiation emission pattern. In addition to the above, in some instances, the emitters (e.g., fins or other extended surface structures) may aid in reducing convective losses in a gap between the intermediate layer and the photovoltaic devices. For example, fin structures may hinder gas flow within the gap and facilitate achieving a gas velocity profile that reduces convective heat transfer.

Moreover, the inventors have recognized and appreciated that in some in some instances, one or more photovoltaic devices in an energy conversion system may not absorb all of the electromagnetic radiation that may be emitted from one or more conduits of the system, and that such unabsorbed radiation may lead to undesirable loss of efficiency in the system and/or heating of the photovoltaic devices. Accordingly, the inventors have appreciated numerous advantages associated with systems that include one or more reflective layers constructed and arranged to reflect at least a portion of the radiation not absorbed by the photovoltaic devices back towards the conduits (e.g., towards a gap between the conduits and the photovoltaic devices. For example, in some embodiments, a reflective layer may be provided behind one or more photovoltaic devices in an energy conversion system, and the photovoltaic devices may be positioned between the reflective layer and a gap between the photovoltaic devices and the conduits carrying the high temperature liquid. The reflective layer may be configured to reflect radiation not absorbed by the photovoltaic devices back towards the gap, such that the radiation may subsequently be absorbed by the photovoltaic devices or absorbed by the conduits or other suitable structure within the system to avoid heat loss, which may reduce the efficiency of the system. For example, if the reflected radiation is absorbed by the conduits, it may aid in maintaining the conduits at a higher temperature such that the conduits can continue to emit additional radiation that may subsequently be absorbed by the photovoltaic devices. In some embodiments, the reflective layer may be configured such that its reflectivity spectrum substantially overlaps with the emission spectrum from the conduits (or other suitable emission structures).

Turning to the figures, specific non-limiting embodiments are described in further detail. It should be understood that the various systems, components, features, and methods described relative to these embodiments may be used either individually and/or in any desired combination as the disclosure is not limited to only the specific embodiments described herein.

FIG. 1 is a schematic representation of one embodiment of an energy storage system 100. The system includes a first liquid storage tank 102 constructed and arranged to contain a high temperature liquid 104, such as liquid silicon at a temperature of about 2400° C., or other appropriate temperature as described above. The first liquid storage tank 102 is fluidly coupled to an energy conversion system 106 via pipes 122, which may include any suitable structure for transporting the high temperature liquid 104. The energy conversion system 106 includes one or more, and in some embodiments, an array of conduits 108 through which the high temperature liquid flows. As the liquid flows through the array, the conduits are heated and emit radiation. The emitted radiation is then absorbed by one or more photovoltaic devices 110 to convert the radiation into electricity, which may be delivered to an external system 124.

In some applications, the high temperature liquid 104 may be held in the first liquid storage tank 102 until energy recovery is desired, at which time the high temperature liquid may be transported to the energy conversion system 106. In some embodiments, the first liquid storage tank may be configured to hold a large volume of the high temperature liquid 104, which may advantageously provide a small surface area to volume ratio for the first liquid storage tank. As discussed above, such configurations may aid in avoiding heat loss while the liquid is stored in the first storage tank. In one exemplary embodiment, the first liquid storage tank 102 may have a diameter, or other transverse dimension, of between about 1 m and about 100 m, and a height of between about 1 m and about 100 m. In some embodiments a surface area to volume ratio may be between about 1.2 $m^{-1}$ and about 0.15 $m^{-1}$. In further embodiments, the dimensions of the tank and suitable insulation may be selected such that less than 1% of the energy stored in the high temperature liquid is lost to heat per day.

After exiting the array 108 of the energy conversion system 106, the liquid (now at a lower temperature due to the emission of radiation within the array 108) flows into a pump 112 which pumps the lower temperature liquid 114 into a second liquid storage tank 116. For example, in one embodiment in which the high temperature liquid is liquid silicon at a temperature of about 2400° C., the liquid silicon may be stored at a temperature of about 1900° C. in the second liquid storage tank. In some applications, the pump 112 also may be used to control flow of the high temperature liquid 104 from the first liquid storage tank 102 to the energy conversion system 106. In some embodiments, the pump 112 may be configured to move the liquid from the first liquid storage tank 102 into a first end of the array of conduits 108 of the energy conversion system 106, move the liquid from a second end of the array of conduits into the second liquid storage tank 116; and move the liquid from the second liquid storage tank, through the heater 118, and into the first liquid storage tank 102. Exemplary pumps that may be suitable for pumping the liquid throughout the system 100 are described in US Patent Application Pub. No. 2018/0045197, which is incorporated herein by reference in its entirety.

When energy is provided to the system from an external energy source 120, which may be any appropriate renewable or non-renewable energy source, the lower temperature liquid 114 may be pumped through a heater 118. The heater may use the energy from the external energy source 120 to heat the liquid using any appropriate heating method (e.g. induction heating, resistive heating, etc.) and raise its temperature to that of the high temperature liquid 104. After heating, the high temperature liquid may be pumped into the first liquid storage tank 102 where the liquid may remain until it is pumped through the system to recover electricity as desired.

Figure 2:
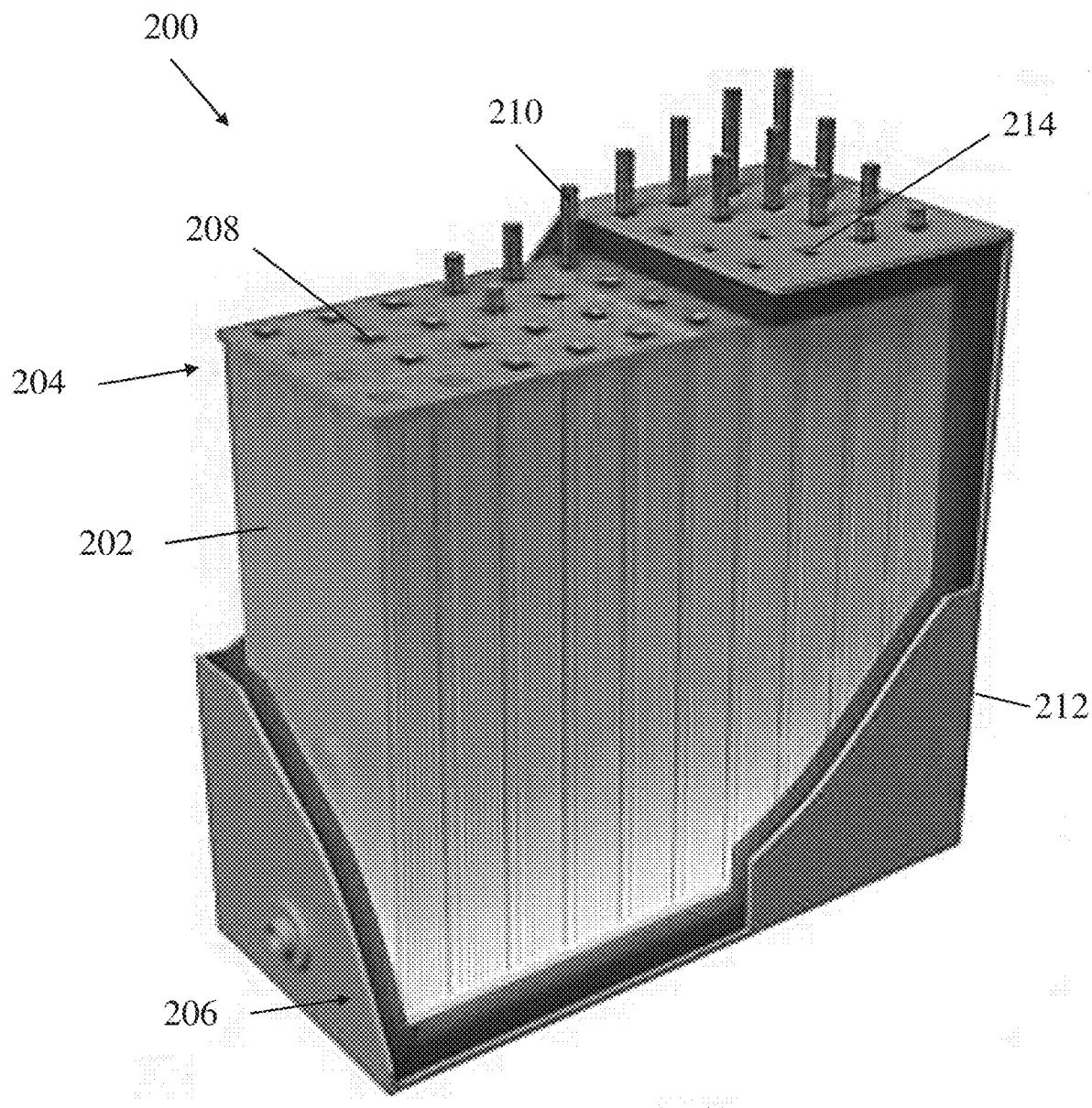
FIG. 2 is a perspective view of an energy conversion system, according to some embodiments.

FIG. 2 shows a perspective view of one embodiment of an energy conversion system 200 including an array of conduits 202 through which a high temperature liquid can flow from a first end of the array 204 to a second end of the array 206. The array 202 includes a plurality of gaps 208, and each gap is constructed and arranged to receive a photovoltaic device 210. The gaps 208 may be formed as open channels extending from the first end of the array 204 toward, and in some embodiments, completely through to the second end of the array 206. In either case, each gap includes at least one end which may be open to the exterior of the array to receive the one or more corresponding photovoltaic devices. The photovoltaic devices 210 may be formed as extended rods such that the photovoltaic devices may extend along at least a portion, and in some embodiments, substantially an entire length of each gap. In some embodiments, the energy conversion system 200 may include a housing 212, and the housing may include openings 214 aligned with the gaps 208 to permit the photovoltaic devices to be inserted into and removed from the array of conduits 202.

While the photovoltaic devices 210 are depicted as having a prismatic rod structure with a rectangular cross-section in the above embodiment, it should be understood that other configurations may be suitable. For example, other cross-sectional geometries, such as circular, triangular, or other polygonal geometries may be suitable. Alternatively or additionally, a photovoltaic device 210 may comprise a planar or slab-like structure, a layered structure, and/or may include one or more channels formed through at least a portion of the length of the photovoltaic device. Accordingly, it should be understood that the current disclosure is not limited to any particular shape or geometry of a photovoltaic device and or the corresponding array of conduits.

Figure 3:
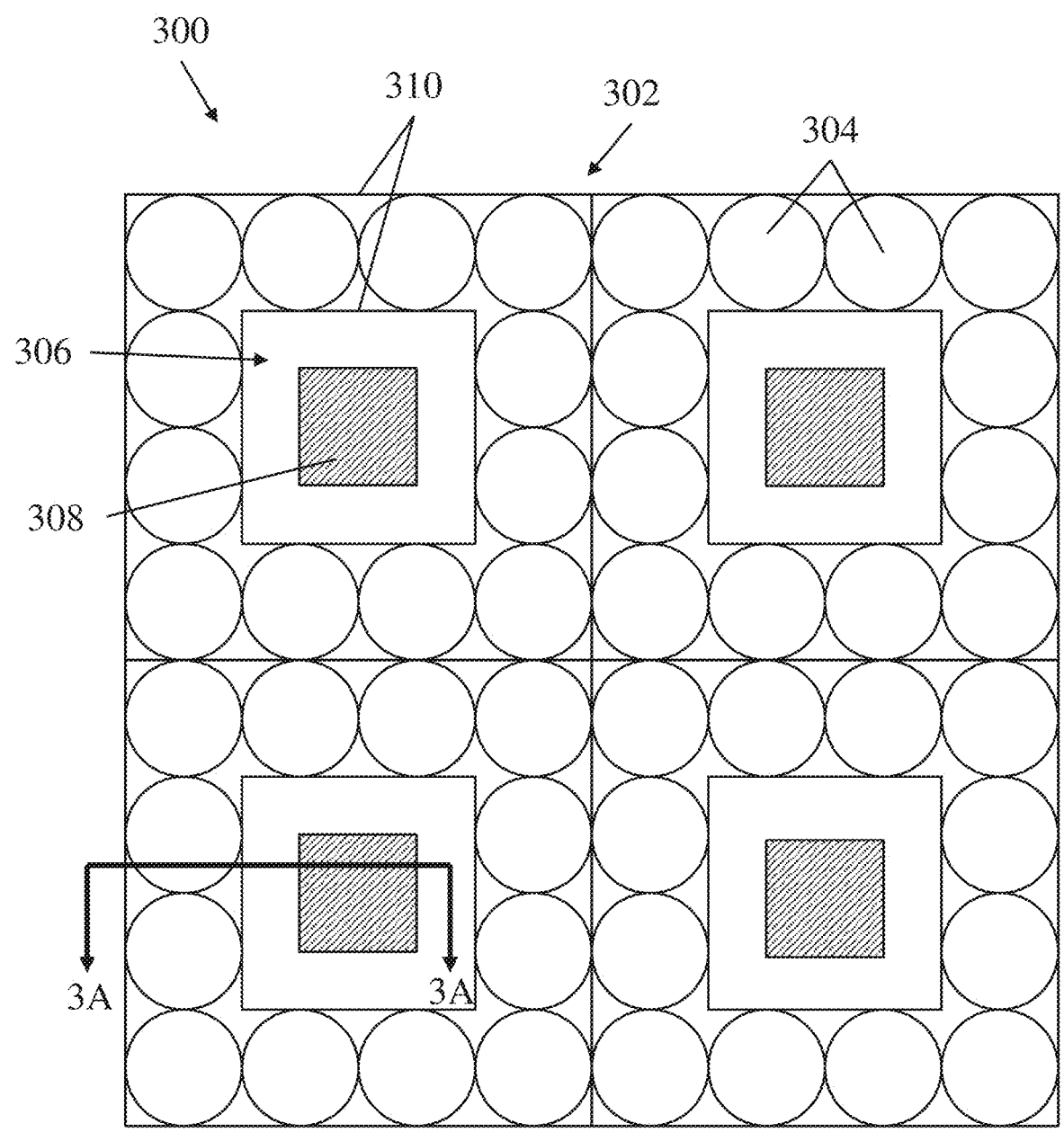
FIG. 3 is a schematic cross-sectional view of a portion of an energy conversion system, according to some embodiments.

FIG. 3 is a cross-sectional top view of one embodiment of an energy conversion system 300 including an array 302 of conduits 304 through which a high temperature liquid may flow, as discussed above. Similar to the embodiment described above, the conduits 304 are arranged to define gaps 306 in which photovoltaic devices 308 may be permanently and/or selectively received.

In the depicted embodiment, intermediate layers 310 are provided between the conduits 304 forming each gap 306 and the corresponding photovoltaic device positioned in the corresponding gap to isolate the photovoltaic devices from the conduits. As discussed above, the intermediate layers may aid in lowering the vapor pressure of sublimated material within the gaps 306. The intermediate layers 310 also may aid in reducing and/or avoiding diffusion of sublimated material from the conduits 304 from diffusing across the gaps 306 and onto the photovoltaic devices 308. For example, the one or more intermediate layers within a system may act as a physical barrier to reduce or prevent diffusion into the gaps 306 between an intermediate layer and an adjacent photovoltaic device. For instance, in some embodiments, the intermediate layer may be formed from a material having a lower vapor pressure than a material of the conduit when at a desired operating temperature, which may result in less sublimation of material into the gap. As illustrated, in some embodiments, multiple intermediate layers 310 may be arranged such that the conduits 304 are positioned between opposing sections of the intermediate layers to form the overall array structure. In this manner, in some embodiments, the intermediate layers 310 may at least partially encase the conduits 304, which may aid in containing sublimated material and avoiding deposition of sublimated material onto the photovoltaic devices 308.

Figure 3A:
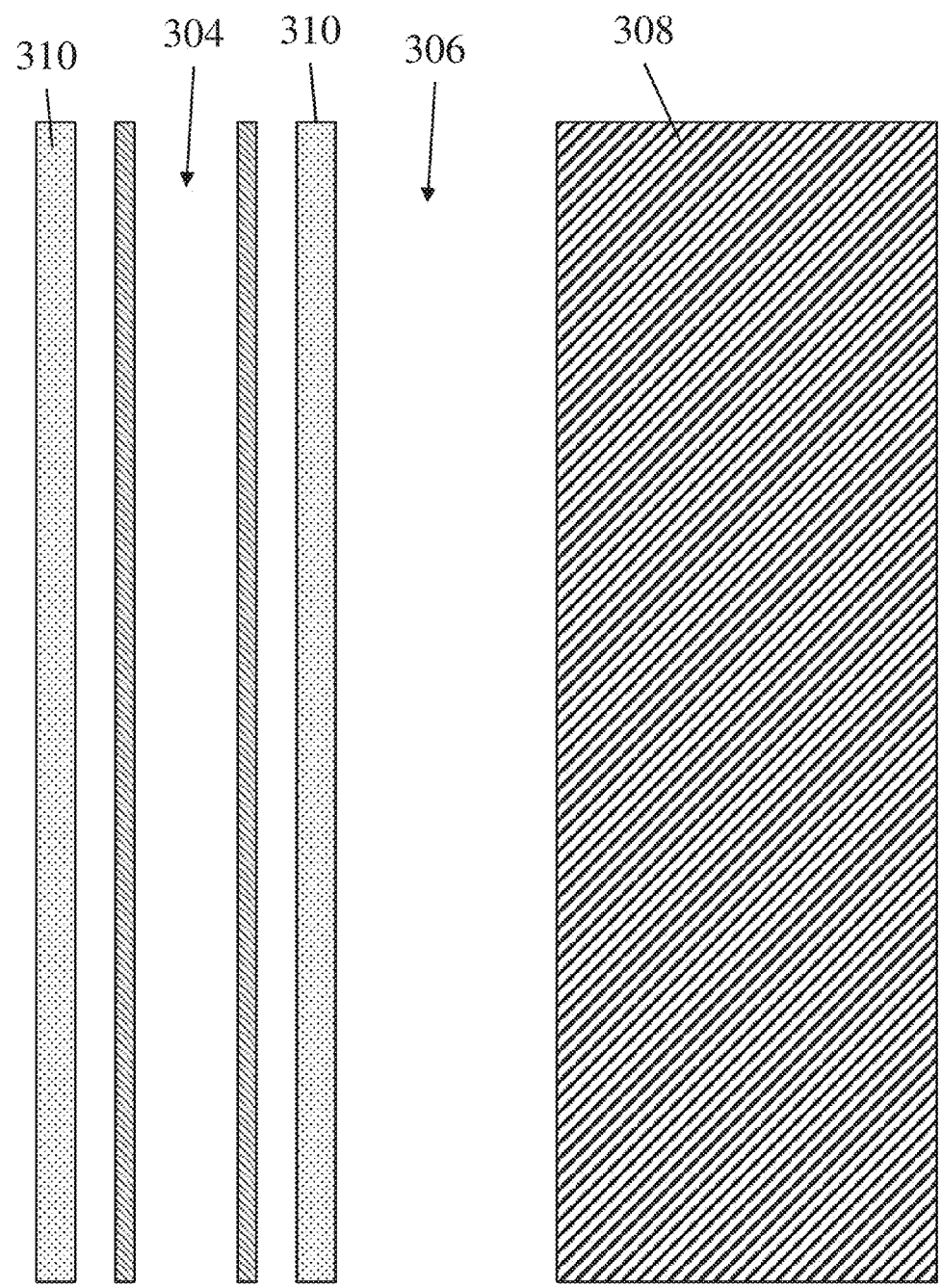
FIG. 3A depicts a portion of the energy conversion system of FIG. 3 along line 3A-3A.

FIG. 3A depicts a cross-sectional view of the energy conversion system 300 taken along line 3A-3A of FIG. 3.

Figure 4:
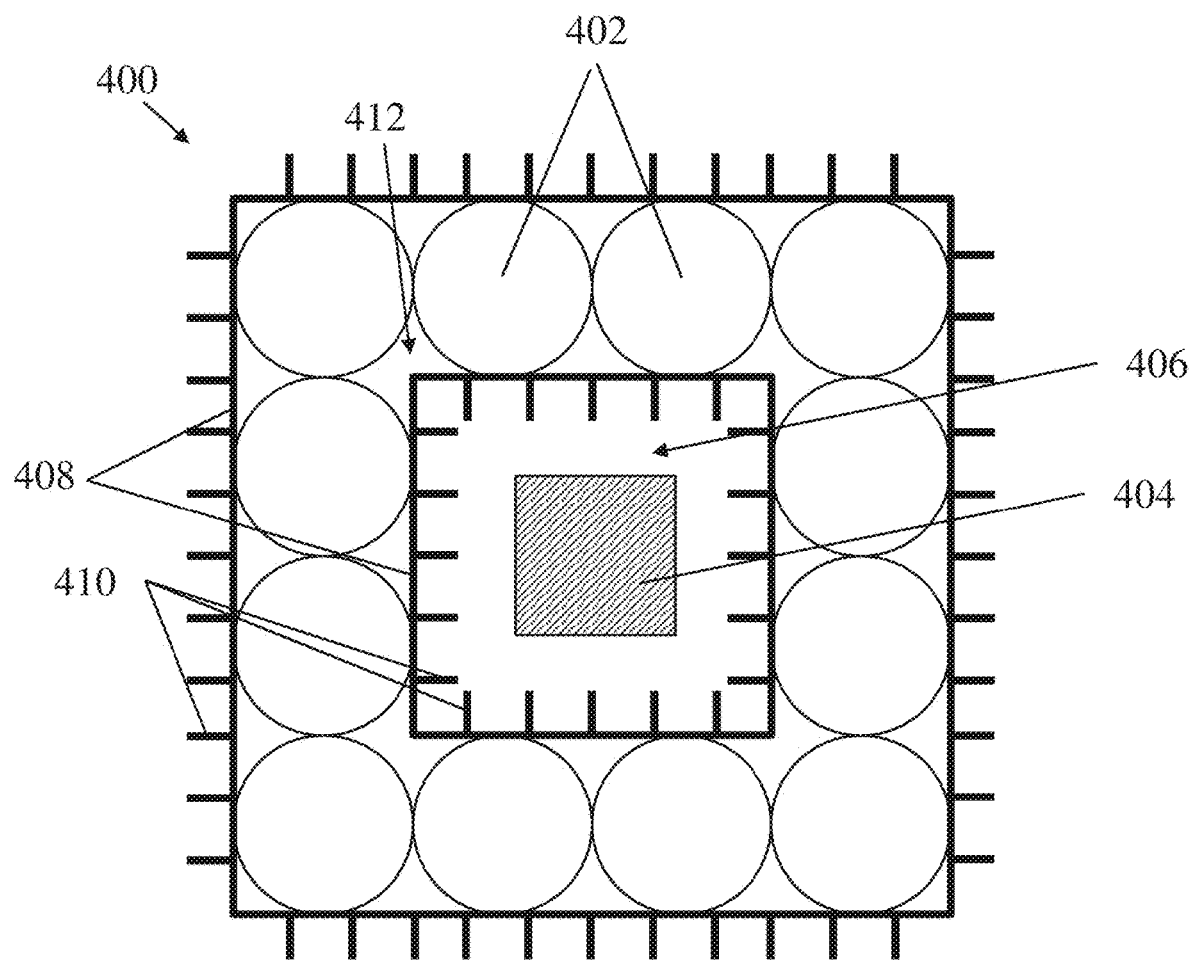
FIG. 4 is a schematic cross-sectional view of a portion of an energy conversion system including a plurality of intermediate layers, according to some embodiments.

Referring now to FIG. 4, aspects related to intermediate layers that may be included in the systems described herein are described in more detail. In particular, FIG. 4 is a cross-sectional top view of a portion of an array 400 of conduits 402, which define a gap 406 in which a photovoltaic device 404 is received. As illustrated, a plurality of intermediate layers 408 may be positioned along opposing sides of the conduits 402. In this manner, at least a portion of the intermediate layers 408 are positioned between the conduits 402 and the gap 406, and in some instances, the intermediate layers may at least partially surround the conduits 402. In some embodiments, the arrangement of the intermediate layers may define one or more conduit regions 412 in which the conduits 402 are positioned, and the intermediate layers may provide a physical barrier between the conduits and the gap 406.

As discussed above, the intermediate layer 408 may be formed from a material having lower vapor pressure than a vapor pressure of a material of the conduits 402 at the elevated operating temperatures of the system. For example, for conduits formed from graphite, the vapor pressure at an exemplary operating temperature of about 2400° C. may be about 10 Pa. The intermediate layer, however, may be formed of a material such as tungsten, which has a vapor pressure well below 1 Pa at this temperature. Accordingly, by placing the intermediate barrier 408 between the conduits and the photovoltaic device 404, the vapor pressure of sublimated material in the gap 406 may be drastically reduced, which may aid in reducing sublimation and corresponding deposition of material onto the photovoltaic device. Additionally, as discussed previously, the intermediate layer 408 may act as physical barrier to prevent or limit diffusion of material from the conduits 402 towards the photovoltaic device 406. For example, any sublimated material from the conduits may be contained between the intermediate layers 408 on either side of the conduits.

As discussed above, in some embodiments, the intermediate layer 408 may further function as an emission surface from which radiation is emitted into the gap 406 towards the photovoltaic device 404. For example, heat from the conduits 402 (e.g., from high temperature liquid flowing through the conduits) may be transferred to the intermediate layer 408 via conduction, convection, and/or radiative heating. Upon heating, the intermediate layer 408 may emit radiation from its surface towards the photovoltaic device.

In the depicted embodiment, the intermediate layer 408 further comprises a plurality of emitters 410 extending from the surface of the intermediate layer. As illustrated, the emitters may be formed as straight fins, and the fins may extend along at least a portion of the length of the conduits 402 and/or along the length of the photovoltaic device 404. For example, in some embodiments, the tins may extend along the entire length of the conduits and/or photovoltaic devices in the array 400. Alternatively, a plurality of discontinuous fins may extend along only a portion of the length of the conduits and/or photovoltaic device. Moreover, while straight fins extending along a direction parallel to the length of the conduits are depicted in FIG. 6, other configurations may be suitable including, for example, fins that are positioned at an angle relative to the length of the conduits as well as fins with curved, wavy, saw tooth, or other configurations including regular and/or irregular shapes or patterns. In some instances, the emitters 408 may aid in providing improved and/or more efficient emission of radiation into the gap 406, for example by providing an increased surface area from which radiation can be emitted.

Depending on the particular embodiment, the conduits 402 and/or intermediate layers 408 may have any suitable dimensions. For example, in some embodiments, wall thickness of the conduits and a thickness of the intermediate layers 408 may be selected based on an expected sublimation rate for the materials of the conduits and intermediate layers at the system's nominal operating temperature. For instance, the thicknesses may be selected such that the conduits and intermediate layers have a useable service life of about 30 years or more. In one exemplary embodiment, the system may include graphite conduits having a wall thickness of between about 1 mm and 1 cm and tungsten intermediate layers having a thickness between about 10 microns and about 5 mm which may provide a service life of approximately 30 years based on the expected sublimation rates of carbon and tungsten at the operating temperature of the array 400.

Figure 5:
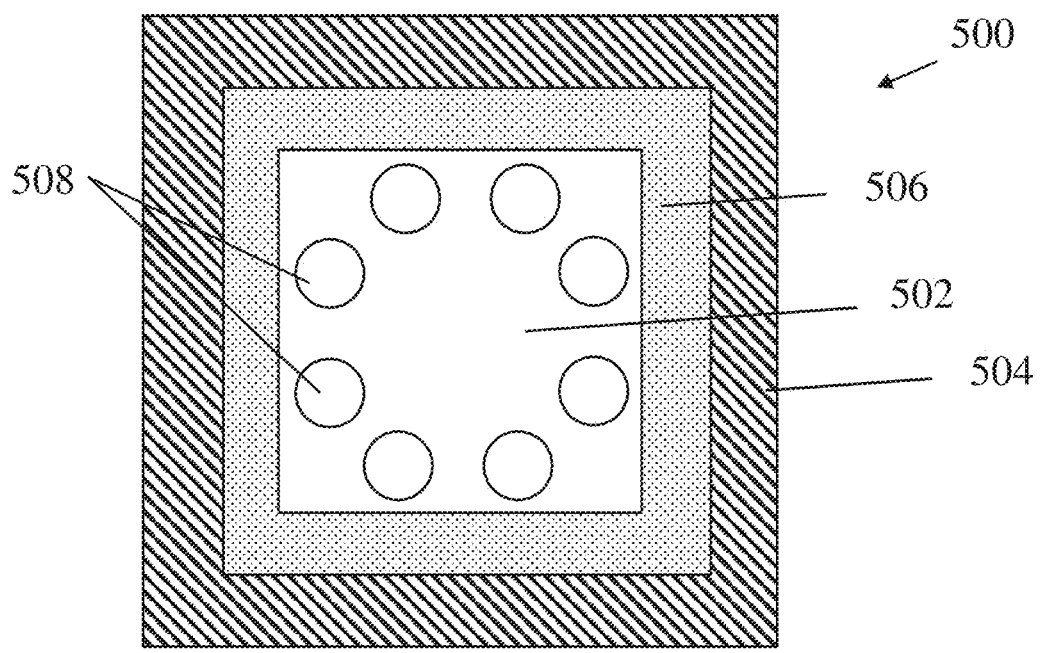
FIG. 5 is schematic cross-sectional view of a photovoltaic device, according to some embodiments.

Referring now to FIG. 5, one embodiment of a photovoltaic device 500 is described in more detail. In particular, FIG. 5 depicts a cross-sectional view of a photovoltaic device that is formed as a prismatic rod, which may, for example, extend along a length of an array of conduits as discussed above. The photovoltaic device 500 includes a central core 502, around which one or more photovoltaic layers 504 are provided on the one or more exterior surfaces of the central core. The photovoltaic layers 504 may include one or more photovoltaic cells configured to convert radiation (e.g., visible light and/or infrared radiation) into electricity, Various configurations of photovoltaic cells may be suitable, including one or more multi-junction photovoltaic cells, single junction photovoltaic cells, and/or combinations of different types of photovoltaic cells selected to provide a desired absorption spectrum. While a photovoltaic device configured as a prismatic rod is depicted, it should be understood that other configurations may be suitable. For example, the photovoltaic device may have a prismatic structure having other cross-sectional shapes (such as triangles, rectangles, other regular or irregular polygons, circles, ovals, etc.), or the photovoltaic device may have a planar configuration (e.g. with photovoltaic layers positioned on one or both sides of a substantially flat planar structure. Accordingly, it should be understood that the current disclosure is not limited to any particular shape and/or configuration for the photovoltaic devices.

In some embodiments, a reflective layer 506 may be provided under the one or more photovoltaic layers 504 such that it is disposed between the central core, or other underlying supporting surface, and the one or more photovoltaic layers. For example, the reflective layer 506 may be configured to reflect radiation not absorbed by the photovoltaic layer 504 back into a gap and towards one or more conduits carrying a high temperature liquid (not depicted in FIG. 5). The reflective layer 506 may be formed of any suitable reflective material, and in some embodiments, the material may be selected to provide a reflectance spectrum that at least partially, and in some embodiments, substantially includes a corresponding emission spectrum of radiation emitted by the conduits. In some instances the reflected radiation may be reabsorbed by the high temperature liquid (e.g., after being absorbed by the conduit), which may aid in maintaining the temperature of the liquid and avoiding energy loss. In other instances the reflected radiation may be subsequently absorbed by the photovoltaic layer 504 after reflecting off of one or more additional surfaces, such as a surface of an intermediate layer in an array of conduits (not depicted).

In some applications it may be desirable to maintain a desired operating temperature of a photovoltaic device. Accordingly, as illustrated in FIG. 5, a photovoltaic device may further include one or more cooling channels 508 formed within the central core 502 or other portion of the device, and a cooling fluid below a desired operating temperature of the photovoltaic device may be flowed through the cooling channels. In this manner, the cooling channels may aid in cooling the one or more photovoltaic layers 506 to maintain a desired operating temperature such that the one or more photovoltaic layers do not become damaged upon exposure to the elevated temperatures associated with the high temperature liquids flowing through the conduits. In one exemplary embodiment, the cooling fluid may comprise water at a temperature of approximately 35° C., and the water may flow through the cooling channels at an appropriate volumetric flow rate for a given size system to provide an appropriate degree of cooling of the photovoltaic layers. It should be appreciated that the central core may include any suitable arrangement of cooling channels, as the current disclosure is not limited in this regard. Moreover, in some instances the reflective layer may aid in avoiding undesired heating of the photovoltaic device by avoiding heat absorption by the photovoltaic device 500, for example by reflecting non-absorbed radiation away from the photovoltaic device.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. An energy storage system comprising:
   a conduit constructed and arranged to transport liquid;
   a photovoltaic device;
   a gap positioned between the conduit and the photovoltaic device; and
   an intermediate layer positioned between the conduit and the gap, wherein a vapor pressure of a material of the intermediate layer is less than a vapor pressure of a material of the conduit.

2. The energy storage system of claim 1, wherein the intermediate layer forms an emission surface constructed and arranged to emit radiation into the gap.

3. The energy storage system of claim 1, further comprising a plurality of emitters on the intermediate layer.

4. The energy storage system of claim 3, wherein the emitters are formed as fins extending from the intermediate layer into the gap.

5. The energy storage system of claim 1, wherein the intermediate layer comprises at least one selected from the group consisting of tungsten, tantalum, rhenium, and alloys thereof.

6. The energy storage system of claim 1, wherein the intermediate layer forms a diffusion barrier constructed and arranged to reduce diffusion of the material of the conduit into the gap.

7. The energy storage system of claim 1, wherein the conduit is formed from graphite.

8. The energy storage system of claim 1, wherein the liquid comprises silicon or ferrosilicon.

9. The energy storage system of claim 1, further comprising a reflective surface, wherein the photovoltaic device is positioned between the reflective surface and the gap.

10. The energy storage system of claim 9, wherein the reflective surface is constructed and arranged to reflect at least a portion of radiation not absorbed by the photovoltaic device towards the gap.

11. An energy storage system comprising:
an array of conduits constructed and arranged to transport a liquid from a first end of the array to a second end of the array;
a plurality of photovoltaic devices;
a plurality of gaps formed in the array of conduits, each gap comprising an opening at at least one end of the array of conduits, wherein each gap is constructed and arranged to receive at least one of the plurality of photovoltaic devices; and
a plurality of intermediate layers positioned between the conduits of the array of conduits and each gap of the plurality of gaps, wherein a vapor pressure of a material of the plurality of intermediate layers is less than a vapor pressure of a material of the array of conduits.

12. The energy storage system of claim 11, wherein the plurality of intermediate layers form a plurality of emission surfaces constructed and arranged to emit radiation into the plurality of gaps.

13. The energy storage system of claim 12, further comprising a plurality of fins extending from each intermediate layer.

14. The energy storage system of claim 11, wherein the plurality of intermediate layers comprise at least one selected from the group consisting of tungsten, tantalum, rhenium, and alloys thereof.

15. The energy storage system of claim 11, wherein the plurality of intermediate layers form a plurality of diffusion barriers constructed and arranged to reduce diffusion of the material of the conduits into the plurality of gaps.

16. The energy storage system of claim 11, wherein the liquid cools from a first temperature at the first end of the array to a second temperature at the second end of the array.

17. The energy storage system of claim 16, wherein the first temperature is between about 1400° C. and about 2600° C.

18. The energy storage system of claim 17, wherein radiation is emitted into the plurality of gaps, at least in part, due to the cooling of the liquid.

19. The energy storage system of claim 16, further comprising:
a first liquid storage tank fluidly coupled to the first end of the array of conduits and constructed and arranged to store the liquid at the first temperature;
a second liquid storage tank fluidly coupled to the second end of the array of conduits and the first tank, the second liquid storage tank constructed and arranged to store the liquid at the second temperature; and
a heater positioned between the first tank and the second tank, the heater constructed and arranged to heat the liquid from the second temperature to the first temperature.

20. The energy storage system of claim 19, further comprising a pump configured to:
move the liquid from the first liquid storage tank into the first end of the array of conduits;
move the liquid from the second end of the array of conduits into the second liquid storage tank; and
move the liquid from the second liquid storage tank, through the heater, and into the first liquid storage tank.

* * * * *